(12) United States Patent
Yanagisawa et al.

(10) Patent No.: US 10,394,284 B2
(45) Date of Patent: Aug. 27, 2019

(54) ELECTRONIC DEVICE AND METHOD FOR DRIVING THE ELECTRONIC DEVICE

(71) Applicant: Semiconductor Energy Laboratory Co., Ltd., Kanagawa-ken (JP)

(72) Inventors: Yuichi Yanagisawa, Tochigi (JP); Nozomu Sugisawa, Kanagawa (JP); Naoyuki Senda, Kyoto (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 57 days.

(21) Appl. No.: 15/613,740

(22) Filed: Jun. 5, 2017

(65) Prior Publication Data
US 2017/0359914 A1 Dec. 14, 2017

(30) Foreign Application Priority Data
Jun. 8, 2016 (JP) .................. 2016-114581

(51) Int. Cl.
| G06F 1/16 | (2006.01) |
| H05K 5/02 | (2006.01) |
| H05K 5/00 | (2006.01) |
| G06F 1/3234 | (2019.01) |

(52) U.S. Cl.
CPC .......... *G06F 1/1652* (2013.01); *G06F 1/1626* (2013.01); *H05K 5/0021* (2013.01); *H05K 5/0086* (2013.01); *H05K 5/0217* (2013.01); *G06F 1/3265* (2013.01); *Y02D 10/153* (2018.01)

(58) Field of Classification Search
CPC ...................................... G03B 21/58
See application file for complete search history.

(56) References Cited

U.S. PATENT DOCUMENTS

| 5,534,888 A * | 7/1996 | Lebby ............... G06F 1/1616 |
| | | 345/672 |
| 6,012,242 A * | 1/2000 | Atkeson ............. G09F 11/23 |
| | | 352/99 |
| 8,319,725 B2 | 11/2012 | Okamoto et al. |
| 8,427,420 B2 | 4/2013 | Yamazaki et al. |

(Continued)

FOREIGN PATENT DOCUMENTS

| CN | 205680381 U | * 11/2016 |
| JP | 2014-197522 A | 10/2014 |

*Primary Examiner* — Christopher E Mahoney
(74) *Attorney, Agent, or Firm* — Husch Blackwell LLP (57) ABSTRACT

An electronic device usable in a manner similar to reading a book and a novel electronic device are provided. The electronic device includes flexible first to n-th display panels (n is a natural number of 4 or more) and an shaft. The first to n-th display panels each include a first surface and a second surface opposite to the first surface. The first and second surfaces are provided with the first and second display portions, respectively. The shaft includes an operating circuit, to which the first to n-th display panels are electrically connected. The first display panel and the second display panel nearest to the first display panel are fixed to the shaft so that an angle formed by straight lines connecting a portion where the first display panel projects from the shaft and the center of the shaft and connecting a portion where the second display panel projects from the shaft and the center of the shaft is $(360/n)°$ in a cross-sectional view along a plane orthogonal to an extending direction of the shaft.

12 Claims, 6 Drawing Sheets

(56) References Cited

U.S. PATENT DOCUMENTS

| | | |
|---|---|---|
| 9,088,006 B2 | 7/2015 | Yamazaki et al. |
| 9,245,484 B2 | 1/2016 | Yamazaki et al. |
| 2009/0219247 A1 | 9/2009 | Watanabe et al. |
| 2017/0364220 A1* | 12/2017 | Karl ........................ G06F 3/147 |

* cited by examiner

ELECTRONIC DEVICE AND METHOD FOR DRIVING THE ELECTRONIC DEVICE

BACKGROUND OF THE INVENTION

1. Field of the Invention

One embodiment of the present invention relates to an electronic device. Another embodiment of the present invention relates to a method for driving an electronic device. Another embodiment of the present invention relates to a display device.

Note that one embodiment of the present invention is not limited to the above technical fields. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, a method for manufacturing any of them, and an electronic device using any of them.

2. Description of the Related Art

Flexible display devices (also referred to as flexible displays) have been developed. For example, a flexible display in which an organic EL element is used as a display element is known (Patent Document 1). Flexible displays are, for example, light and have excellent portability as their properties, and thus have been expected to be developed as display devices for the coming smartphones and tablet devices.

In addition, flexible displays are as thin as paper. A technique utilizing this property is known, and the user can operate intuitively flexible displays on which texts, pictures, and the like are displayed as if reading a book by this technique. An information display terminal in which bend sensors are incorporated in its display unit and the display is scrolled at a speed which is determined by how the display unit is bent is disclosed in Patent Document 2, for example.

REFERENCE

Patent Document

[Patent Document 1] Japanese Published Patent Application No. 2014-197522
[Patent Document 2] United States Patent Application Publication No. 2009/0219247

SUMMARY OF THE INVENTION

However, although an operation for turning pages by the technique disclosed in Patent Document 2 is close to a motion of reading a book, the user merely picks up an end portion (part) of the flexible display, that is, the user cannot reproduce a motion of completely turning over the page in order to read the next page in reading a book. Furthermore, the information display terminal of Patent Document 2 has only one display unit; thus, it is not possible to reproduce a state in which pictures or texts are also displayed overleaf like a book.

An object of one embodiment of the present invention is to provide an electronic device which is usable in a manner similar to reading. Another object is to provide a novel electronic device.

Note that the description of these objects do not disturb the existence of other objects. In one embodiment of the present invention, there is no need to achieve all the objects. Other objects will be apparent from and can be derived from the descriptions of the specification, the drawings, the claims, and the like.

One embodiment of the present invention is an electronic device including first to n-th display panels (n is a natural number of 4 or more) and a shaft. The first to n-th display panels are flexible. Each of the first to n-th display panels includes a first surface and a second surface opposite to the first surface. The first surface is provided with a first display portion. The second surface is provided with a second display portion. The shaft includes an operating circuit. The first to n-th display panels are electrically connected to the operating circuit. The first display panel and the second display panel, which is the nearest to the first display panel, are fixed to the shaft so that an angle formed by a straight line connecting a portion of the shaft from which the first display panel projects and the center of the shaft and a straight line connecting a portion of the shaft from which the second display panel projects and the center of the shaft is more than or equal to $((360/n)-5)°$ and less than or equal to $((360/n)+5)°$ in a cross-sectional view along a plane orthogonal to an extending direction of the shaft.

The above electronic device in which a housing, a roller, and a motor are included, the shaft is fixed to the housing so as to be rotatable, the roller is provided inside the housing and below the first to n-th display panels, the roller has a function of turning over the first display panel to the other side beyond the shaft, and the motor is connected to a rotating shaft of the roller is also one embodiment of the present invention.

The electronic device in which the roller is positioned so as to overlap with the shaft is also one embodiment of the present invention.

The electronic device in which a battery is included and the battery is provided inside the shaft is also one embodiment of the present invention.

The electronic device in which a battery is included and the battery is provided on a bottom surface of the housing is also one embodiment of the present invention.

The electronic device in which a proximity sensor is included, the proximity sensor is electrically connected to the motor, the proximity sensor has a function of sensing approach of an object, and a sensing medium of the proximity sensor is a DC magnetic field, an AC magnetic field, an electric field, an electromagnetic wave, light, and ultrasonic is also one embodiment of the present invention.

The electronic device in which the proximity sensor includes a first sensing portion, and the first sensing portion is provided on a straight line together with the center of the shaft and the top of the roller in a cross-sectional view along a plane orthogonal to an extending direction of the shaft is also one embodiment of the present invention.

The electronic device in which the proximity sensor includes a first sensing portion and a second sensing portion, and the first sensing portion and the second sensing portion are arranged in a direction parallel to a direction in which the first display panel is turned over by the roller is also one embodiment of the present invention.

One embodiment of the present invention is a method for driving the above electronic device in which the motor keeps rotating the roller as long as the first sensing portion senses approach of the first display panel.

One embodiment of the present invention is a method for driving the above electronic device in which the motor keeps rotating the roller as long as at least one of the first sensing portion and the second sensing portion senses approach of the first display panel.

One embodiment of the present invention can provide an electronic device which is usable in a manner similar to reading a book. Another embodiment of the present invention can provide a novel electronic device.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments. Note that in structures of the present invention described below, the same portions or portions having similar functions are denoted by the same reference numerals in different drawings, and a description thereof is not repeated.

Embodiment 1

An electronic device of one embodiment of the present invention includes a plurality of display panels, specifically n display panels (n is a natural number of 4 or more). The plurality of display panels are flexible and capable of double sided display. In addition, the electronic device includes a rotatable shaft to which each of the plurality of display panels is connected.

The electronic device of one embodiment of the present invention includes two display panels which can be opened so as to be line-symmetrical with respect to the shaft like a book opened as a double-page spread. In addition, one or more display panels can be provided below each of the two display panels.

Thus, as one display panel is turned over, another display panel is visible, so that the electronic device of one embodiment of the present invention is usable in a manner similar to reading a book.

Hereinafter, the electronic device of one embodiment of the present invention in which n is 4 will be described with reference to FIGS. 1A to 1C, FIGS. 2A and 2B, FIGS. 3A to 3D, and FIGS. 4A to 4C.

Note that components with ordinal numbers such as "first" and "second" can be interchanged with each other in this specification.

<Structure of Electronic Device>

Figure 1A:
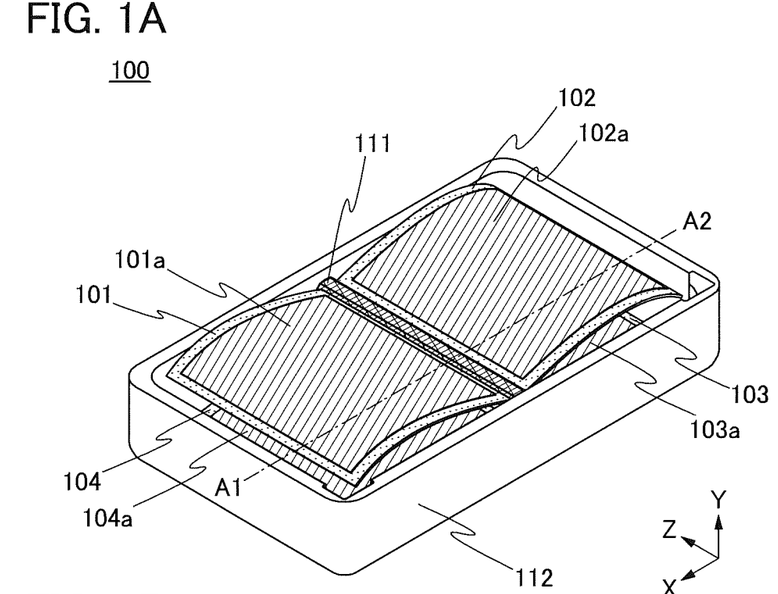
FIGS. 1A to 1C illustrate a structure of an electronic device of an embodiment.
Figure 1B:
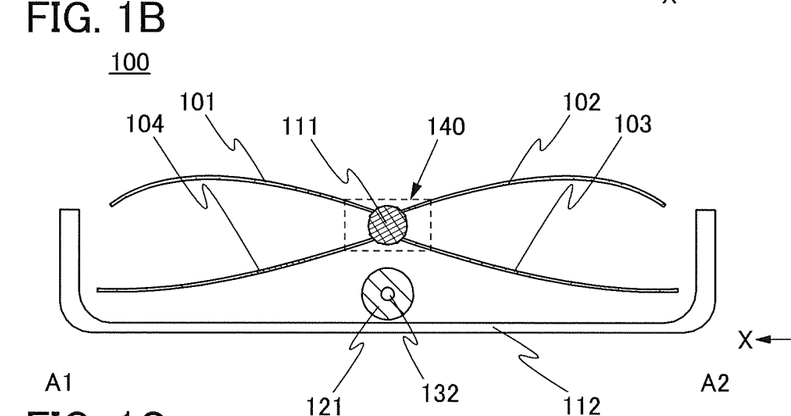

FIG. 1A is a perspective view of an electronic device 100 of one embodiment of the present invention. FIG. 1B is a cross-sectional view along dashed-dotted line A1-A2 in FIG. 1A.

Figure 2A:
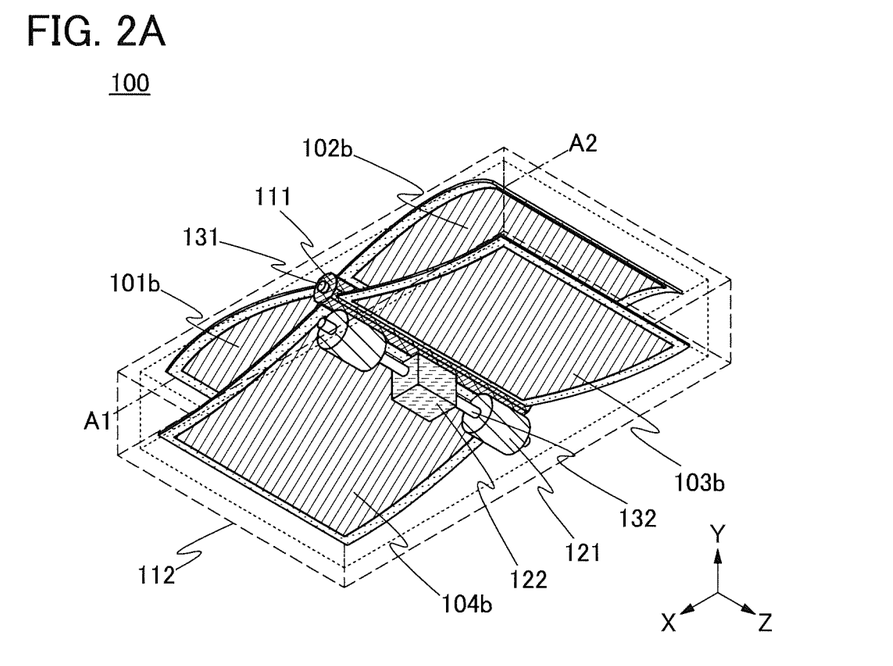
FIGS. 2A and 2B each illustrate a structure of an electronic device of an embodiment.

The electronic device 100 includes four display panels (a display panel 101, a display panel 102, a display panel 103, and a display panel 104), a shaft 111, a housing 112, a roller 121, and a motor 122 (see FIGS. 1A and 1B, and FIG. 2A). Hereinafter, the four display panels are also referred to as "display panels." FIG. 2A is a rear perspective view of the electronic device 100. In FIG. 2A, the housing 112 is illustrated such that only its outlines are drawn with dashed lines and dotted lines. The dashed lines outline the external surfaces of the housing 112, and the dotted lines outline the inner surfaces of the housing 112.

The display panels are each flexible.

The display panels are each capable of double-sided display. That is, the display panels each include a first surface and a second surface opposite to the first surface. The first surface is provided with a first display portion. The second surface is provided with a second display portion. Specifically, in the display panel 101, the first surface is provided with a first display portion 101a and the second surface is provided with a second display portion 101b. In the display panel 102, the first surface is provided with a first display portion 102a and the second surface is provided with a second display portion 102b. In the display panel 103, the first surface is provided with a first display portion 103a and the second surface is provided with a second display portion 103b. In the display panel 104, the first surface is provided with a first display portion 104a and the second surface is provided with a second display portion 104b (see FIG. 1A and FIG. 2A).

The first display portion and the second display portion included in each of the display panels include a plurality of pixels including display elements. As the display elements, organic EL elements, liquid crystal elements, electrophoretic elements, or the like can be used. Therefore, the electronic device 100 can also be a display device. Note that the display elements may be the same or different between the display panels. In addition, the first display portion and the second display portion in any one of the display panels may have the same display elements or different display elements.

Note that an in-cell touch sensor may be incorporated in each of the above display portions. Alternatively, at least one of the first surface and the second surface in each of the display panels may be provided with a touch panel. The touch panel is flexible.

The shaft 111 includes an operating circuit (not illustrated) for controlling display of each of the display panels. The operating circuit is electrically connected to each of the display panels. The display panels are each connected to the operating circuit via flexible printed circuits (FPC) included in the display panels, for example. In this case, the FPC is preferably contained inside the shaft 111. In addition, a battery (not illustrated) which is electrically connected to the operating circuit is provided inside the shaft 111.

Note that the battery may be provided inside the housing 112, for example on a bottom surface of the housing 112. The structure in which the battery is provided on the bottom surface of the housing 112 will be described in Embodiment 2.

The operating circuit is capable of independent control of the display panels; specifically, the turning on/off and display contents of each of the display panels can be individually controlled. In addition, the operating circuit is capable of independent control of display and non-display of each of the first display portion and the second display portion in any one of the display panels. For example, it is possible to display images on the first display portion 101*a* and the first display portion 102*a* and to display no images on the other display portions.

The display panels are each fixed to the shaft 111. For example, the display panels are fixed to the shaft 111 such that the display panels are arranged in a radial pattern from the shaft 111 in the cross-sectional view of FIG. 1B. The shaft 111 can be fixed to the housing 112 so as to be rotatable. For example, the shaft 111 includes a rotating shaft 131 for fixing the shaft 111 to the housing 112 such that the shaft 111 is rotatable (see FIG. 2A). These structures enable the user to perform continuously motions of picking part of one display panel and turning over the display panel to the other side beyond the shaft (that is, motions of turning over pages) on a plurality of adjacent display panels.

Note that it is preferable that, in each of the display panels, a frame region placed between the display portion and the shaft 111 be more highly flexible than other regions of the display panel. The highly flexible frame regions enable the display panels to be highly browsable when the display panels are opened as a double-page spread (when the two display panels to browse are located on the right and left of the shaft 111).

Figure 1C:
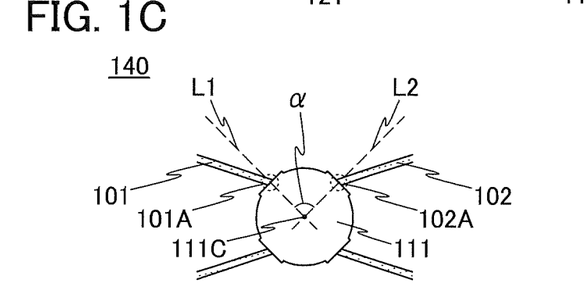

A specific structure for fixing the display panels to the shaft 111 is described with reference to FIG. 1C. FIG. 1C is an enlarged cross-sectional view of a region 140 surrounded by a dashed line in FIG. 1B. In FIG. 1C, the shaft 111 is not shaded for simplicity.

It is assumed that a straight line connecting a center 111C of the shaft 111 and a portion 101A where a given one of the display panels (for example, the display panel 101) projects from the shaft 111 is L1. It is assumed that a straight line connecting the center 111C of the shaft 111 and a portion 102A where a display panel (for example, the display panel 102) nearest to the one of the display panels projects from the shaft 111 is L2. At this time, each of the display panels is preferably fixed to the shaft 111 so that an angle α formed by L1 and L2 is $(360/n)°$. In this embodiment, n is 4; thus, a is preferably 90°. Note that the angle α contains a certain error in an actual case. For example, the angle α is more than or equal to $((360/n)-5)°$ and less than or equal to $((360/n)+5)°$. In this embodiment, the angle α is more than or equal to 85° and less than or equal to 95°

The rotating shaft 131 may be attachable to and detachable from the housing 112. In this case, the shaft 111 and the display panels may be usable when being detached from the housing 112. That is, the shaft 111 and the display panels are also the electronic device of one embodiment of the present invention.

The roller 121 is provided inside the housing 112 and below the display panels (see FIG. 1B and FIG. 2A). The roller 121 is connected to the motor 122 via a rotating shaft 132. The motor 122 can rotate the roller 121 by being driven.

Note that although an example in which the roller 121 is positioned so as to overlap with the shaft 111 is shown in FIG. 1B and FIG. 2A, the roller 121 may be positioned so as not to overlap with the shaft 111. In addition, FIG. 2A shows an example in which two rollers 121 are provided; however, the number of the rollers 121 may be one or three or more. For example, one or a plurality of rollers 121 may be provided so as to overlap with each of the display panel 101 and the display panel 102.

The roller 121 rotates in contact with a given one of the display panels, so that the one display panel can be turned over to the other side beyond the shaft 111. Thus, the roller 121 provided in the electronic device 100 makes it possible to repeat the above motion of turning a page in the same direction any number of times without limitation on the number of the display panels included in the electronic device 100.

For example, the roller 121 is rotated at the time when or before the user finishes turning over one page of the display panels, which enables both the right and left sides of the shaft 111 to be constantly provided with two display panels. Thus, as one display panel is turned over, another display panel is visible, so that the electronic device 100 is usable in a manner similar to reading a book.

The user may judge and decide when to rotate the roller 121. For example, a switch or a button for controlling the driving of the motor 122 is provided on the outer side of the housing 112. Alternatively, a structure in which the roller 121 rotates in time with a page to be turned over may be employed; accordingly, the user can use the electronic device 100 in a manner more similar to reading a book.

Figure 2B:
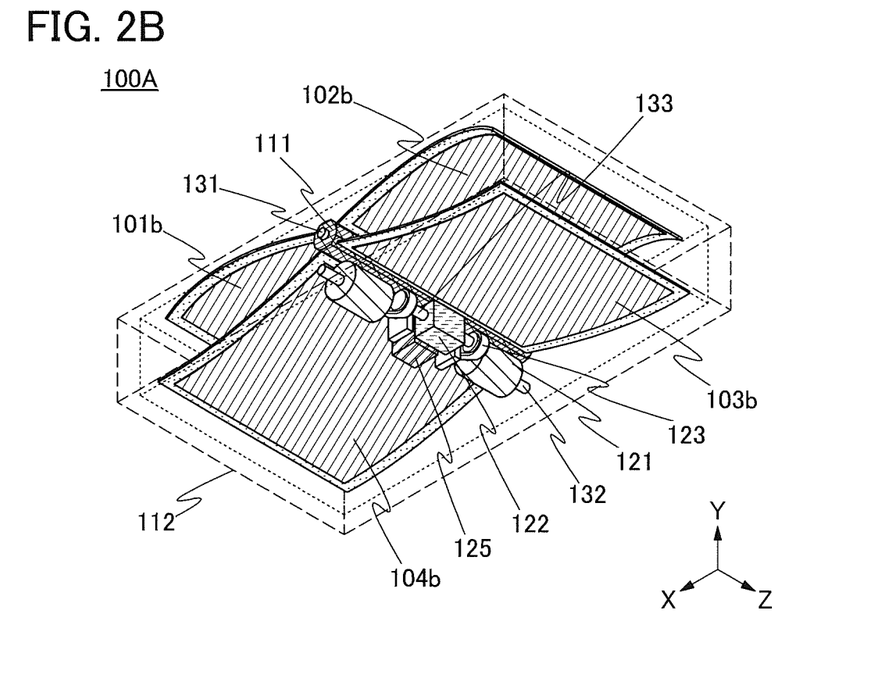

FIG. 2B is a rear perspective view of an electronic device 100A of one embodiment of the present invention in which a proximity sensor 125 is provided. The electronic device 100A is different from the electronic device 100 mainly in including the proximity sensor 125. The proximity sensor 125 is provided at a position at least partly overlapping with the shaft 111, for example.

The proximity sensor 125 has a function of sensing approach of an object. As a sensing medium of the proximity sensor 125, a DC magnetic field, an AC magnetic field, an electric field, an electromagnetic wave, light, ultrasonic, and the like can be given.

It is preferable that a sensing portion (not illustrated) of the proximity sensor 125 be provided inside the housing 112 and have such a sensitivity that when a given one of the display panels is in contact with the roller 121, the approach or contact of the display panel can be sensed. FIG. 2B shows an example in which the sensing portion is provided at a position overlapping with a straight line which extends in an extending direction of the shaft 111 through a top of the roller 121 in a Y direction of the diagram.

The proximity sensor 125 is electrically connected to the motor 122. This structure enables a signal of approach or contact of the display panel which is sensed by the proximity sensor 125 to function as a trigger for driving the motor 122. Note that the proximity sensor 125 may be provided with a circuit for converting the sensed signal to a signal for controlling the driving of the motor 122.

FIG. 2B shows an example in which the roller 121 and the proximity sensor 125 are provided so as to overlap with the shaft 111 and the motor 122 and the proximity sensor 125 do not overlap with each other. The motor 122 includes a rotating shaft 133, which is different from the rotating shaft 132 included in the roller 121. The electronic device 100A includes a pulley 123 for transmitting rotation of the rotating shaft 133 to the rotating shaft 132. Note that the rotating shaft 132 and the rotating shaft 133 may be provided with gears instead of the pulley 123, and the gears may engage. Alternatively, the proximity sensor 125 may be provided over the motor 122 in FIG. 2A.

<Driving Method 1 of Electronic Device>

Here, a driving method of the electronic device 100A for a motion of turning over a page will be described with reference to FIGS. 3A to 3D. FIGS. 3A to 3D are schematic cross-sectional views in which only some components of the electronic device 100A are illustrated. FIGS. 3A to 3D illustrate states of the electronic device 100A in which one page is turned over (for example, the display panel 102 is moved to the other side over the shaft 111).

Note that although a sensing portion 125a is provided over the proximity sensor 125 in FIGS. 3A to 3D, the sensing portion 125a may be included in the proximity sensor 125. The sensing portion 125a is provided, for example, so as to be placed in a straight line connecting the center 111C of the shaft 111 and a top 121T of the roller 121 in a cross-sectional view along a plane orthogonal to the extending direction of the shaft 111 (see FIG. 3A).

(First State)

On the left side of the shaft 111, the display panel 101 is placed over the display panel 104. On the right side of the shaft 111, the display panel 102 is placed over the display panel 103 (see FIG. 3A).

Figure 3A:
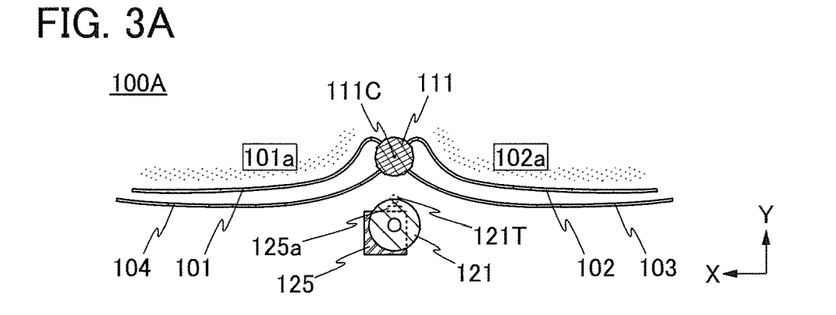
FIGS. 3A to 3D illustrate a method for driving an electronic device of an embodiment.

In the first state, the user can make the display portion 101a and the display portion 102a perform displaying images and see them. At this time, the display panel 103 and the display panel 104 can be turned off. The display portion 101b and the display portion 102b can be turned to non-display. The display portions included in the electronic device 100A that the user is not browsing are turned to non-display, whereby the power consumption of the electronic device 100A can be reduced.

(Second State)

Figure 3B:
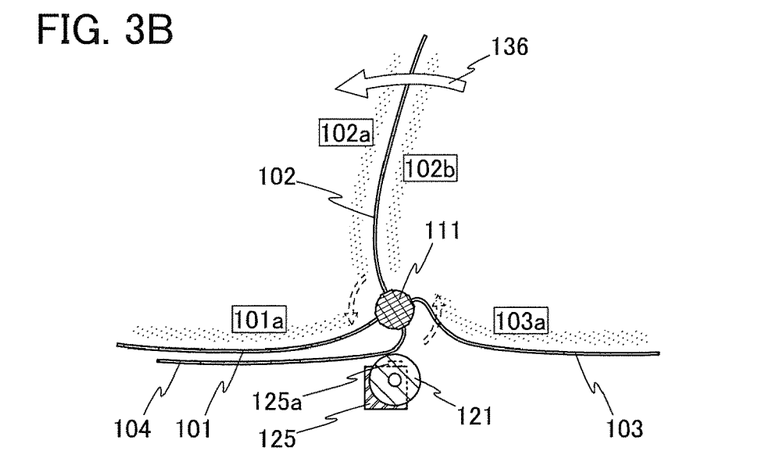

FIG. 3B illustrates the electronic device 100A in which the user is turning over a page (the display panel 102) from the first state that is a start state, that is, the user is picking part of the display panel 102 and moving the display panel 102 to the other side over the shaft 111. The shaft 111 rotates in a direction indicated by dashed line arrows in the diagram by the user's pulling of the display panel 102 in a direction of an arrow 136 in the diagram. The display panels each project from a predetermined portion of the shaft 111, so that the display panels move as the shaft 111 rotates.

When the shaft 111 is rotated over a certain angle from the first state, the display panel 104 touches the roller 121. It is preferable that the motor 122 (not illustrated) be driven and then the roller 121 start rotating just before or just after the roller 121 touches the display panel 104. In FIG. 3B, the display panel 104 almost reaches a detectable area of the sensing portion 125a of the proximity sensor 125. When the shaft 111 is further rotated from the state in FIG. 3B, the motor 122 is driven and then the roller 121 starts rotating.

In the second state, the user can make the display portion 101a, the display portion 102a, the display portion 102b, and the display portion 103a perform displaying images and see them. At this time, the display panel 104 can be turned off. The display portion 101b and the display portion 103b can be turned to non-display.

The user may judge and decide when to display images on the display portion 102b and the display portion 103a from the first state to the second state. For example, a switch or a button for controlling the power of the display panels and/or the display/non-display switching of the display portions of the display panels is provided on the outer side of the housing 112. Alternatively, a structure in which images are displayed on the display portion 102b and the display portion 103a in time with a page to be turned over may be employed. Accordingly, the user can use the electronic device 100 in a manner more similar to reading a book.

For example, part of each of the display panels (e.g., an end portion of the display panel) can be provided with a touch sensor. Thus, images can be displayed on the display portion 102b and the display portion 103a when the touch sensor senses the user's action of picking one of the display panels (the display panel 102 in the case of FIG. 3B) in order to turn over a page. When each of the display panels includes a touch sensor or both sides of each of the display panels are provided with touch panels, touch sensing of part of a region of the touch panel may be used as a trigger for displaying images on the display portion 102b and the display portion 103a.

(Third State)

Figure 3C:
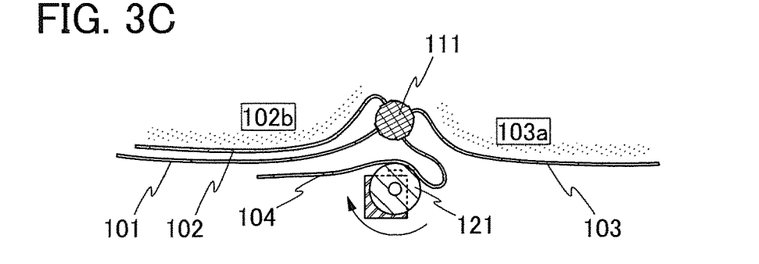
Figure 3D:
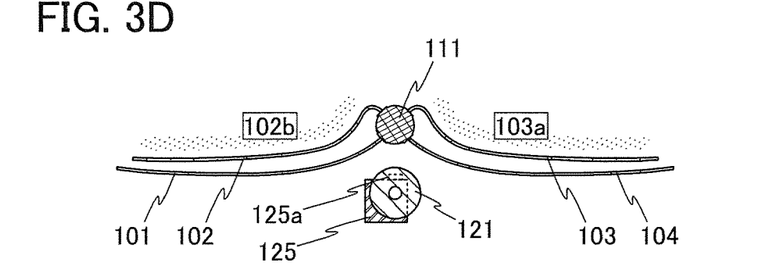

FIG. 3C illustrates the electronic device 100A in which the roller 121 is rotating in a direction of a solid arrow and moving the display panel 104 to the other side (the right side of the shaft 111) below the shaft 111. FIG. 3D illustrates the electronic device 100A in which the user completely turns over the page (the display panel 102).

In the third state, the user can make the display portion 102b and the display portion 103a perform displaying images and see them. At this time, the display panel 101 and the display panel 104 can be turned off. The display portion 102a and the display portion 103b can be turned to non-display.

The user may judge and decide when to turn off display of the display portion 101a and the display portion 102a from the second state to the third state. Alternatively, as described above, the touch sensing of the touch panel or the touch sensor may be linked together with the turning off of the display. For example, when touch sensing is performed by the user's picking of the page (the display panel 102), images are displayed on the display portion 102b and the display portion 103a as described above, and this state is the second state. Then, when the user completely turns over the page and releases the display panel 102, touch is not sensed and then the image display of the display portion 101a and the display portion 102a is turned off.

(Fourth State)

FIG. 3D illustrates the electronic device 100A in which the display panel 104 is completely moved to the right side of the shaft 111 by rotation of the roller 121. In the fourth state, on the left side of the shaft 111, the display panel 102 is placed over the display panel 101. On the right side of the shaft 111, the display panel 103 is placed over the display panel 104. Therefore, both the right and left sides of the shaft 111 are provided with two display panels as in the first state; thus, a motion of turning over the following page (the display panel 103) can be sequentially performed.

In the fourth state, the roller 121 is not rotated. The timing of stopping the rotation of the roller 121 can be determined as appropriate from the third state to the fourth state. For example, the driving of the motor 122 can be stopped and then the rotation of the roller 121 can be stopped just after or after a certain period of time has passed since the sensing portion 125a stops sensing approach of one of the display panels (the display panel 104 in the case of FIG. 3C). In other words, as long as the sensing portion 125a senses approach of one of the display panels, the motor 122 makes the roller 121 rotate continuously.

Note that although FIGS. 3A to 3D show an example in which the proximity sensor 125 includes one sensing portion 125a, the proximity sensor 125 may include a plurality of sensing portions. Alternatively, the electronic device of one embodiment of the present invention may be provided with a plurality of proximity sensors 125.

<Driving Method 2 of Electronic Device>

Figures 4A, 4B:
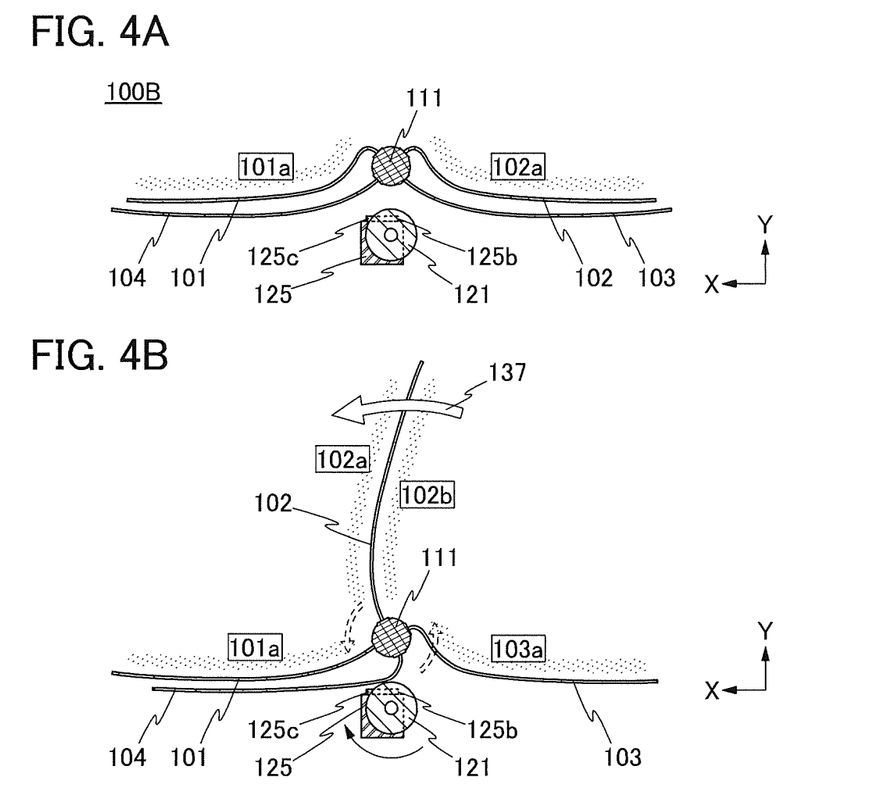
FIGS. 4A to 4C illustrate a method for driving an electronic device of an embodiment.
Figure 4C:
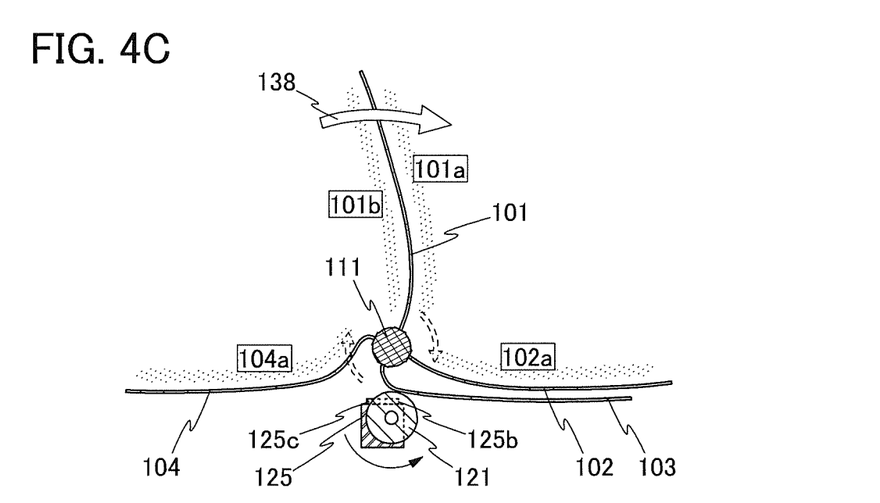

Hereinafter, a driving method of an electronic device 100B for a motion of turning over a page, which is different from the above driving method, will be described with reference to FIGS. 4A to 4C. FIGS. 4A to 4C are schematic cross-sectional views in which only some components of the electronic device 100B are illustrated.

The electronic device 100B is the same as the electronic device 100A, except that the proximity sensor 125 in the electronic device 100B includes two sensing portions 125b and 125c. Therefore, except for that point of the electronic device 100B, the description of the electronic device 100A can be referred to.

The sensing portion 125b and the sensing portion 125c are preferably arranged in a direction (an X direction in FIG. 4B) parallel to a direction in which the roller 121 turns over a given one of the display panels (the display panel 104 in the case of FIG. 4B) as illustrated in FIG. 4B. This arrangement makes it possible to judge whether the pages are turned over in order (a page on the right of the shaft 111 is turned over to the left) or in reverse (a page on the left of the shaft 111 is turned over to the right).

Note that although the sensing portion 125b and the sensing portion 125c are provided over the proximity sensor 125 in FIGS. 4A to 4C, the sensing portion 125b and the sensing portion 125c may be included in the proximity sensor 125.

(Fifth State)

On the left side of the shaft 111, the display panel 101 is placed over the display panel 104. On the right side of the shaft 111, the display panel 102 is placed over the display panel 103 (see FIG. 4A).

In the fifth state, the user can make the display portion 101a and the display portion 102a perform displaying images and see them. At this time, the display panel 103 and the display panel 104 can be turned off. The display portion 101b and the display portion 102b can be turned to non-display.

(Sixth State)

FIG. 4B illustrates the electronic device 100B in which the user is turning over a page (the display panel 102) in order from the fifth state that is a start state. The shaft 111 rotates in a direction indicated by dashed line arrows in the diagram by the user's pulling of the display panel 102 in a direction of an arrow 137 in the diagram.

The rotation of the shaft 111 makes the display panel 104 move, and the display panel 104 becomes close to the sensing portion 125c before becoming close to the sensing portion 125b because of the arrangement of the sensing portion 125b, the sensing portion 125c, and the display panel 104 (see FIG. 4B).

The sensitivity of the sensing portion 125b is set at approximately the same level as the sensitivity of the sensing portion 125c; thus, the sensing portion 125c can sense approach or contact of the display panel 104 first in the sixth state. When the sensing portion 125c senses the approach or contact ahead of the sensing portion 125b, the roller 121 is rotated in a direction of a solid arrow in FIG. 4B. Accordingly, the display panel 104 can be turned over toward a side (the right side of the shaft 111) opposite to the side toward which the display panel 102 is turned over.

Note that the timing of stopping the rotation of the roller 121 can be determined as appropriate after the sixth state. For example, the driving of the motor 122 can be stopped and then the rotation of the roller 121 can be stopped just after or after a certain period of time has passed since the sensing portion 125b stops sensing approach of one of the display panels (the display panel 104 in the case of FIG. 4B).

In the sixth state, the user can make the display portion 101a, the display portion 102a, the display portion 102b, and the display portion 103a perform displaying images and see them. At this time, the display panel 104 can be turned off. The display portion 101b and the display portion 103b can be turned to non-display.

(Seventh State)

FIG. 4C illustrates the electronic device 100B in which the user is turning over a page (the display panel 101) in reverse from the fifth state that is a start state. The shaft 111 rotates in a direction indicated by dashed line arrows in the diagram by the user's pulling of the display panel 101 in a direction of an arrow 138 in the diagram.

The rotation of the shaft 111 makes the display panel 103 move, and the display panel 103 becomes close to the sensing portion 125b before becoming close to the sensing portion 125c because of the arrangement of the sensing portion 125b, the sensing portion 125c, and the display panel 103 (see FIG. 4C).

The sensitivity of the sensing portion 125b is set at approximately the same level as the sensitivity of the sensing portion 125c; thus, the sensing portion 125b can sense approach or contact of the display panel 103 first in the seventh state. When the sensing portion 125b senses the approach or contact ahead of the sensing portion 125c, the roller 121 is rotated in a direction of a solid arrow in FIG. 4C. Accordingly, the display panel 103 can be turned over toward a side (the left side of the shaft 111) opposite to the side toward which the display panel 101 is turned over.

Note that the timing of stopping the rotation of the roller 121 can be determined as appropriate after the seventh state. For example, the driving of the motor 122 can be stopped and then the rotation of the roller 121 can be stopped just after or after a certain period of time has passed since the sensing portion 125c stops sensing approach of one of the display panels (the display panel 103 in the case of FIG. 4C).

In the seventh state, the user can make the display portion 104a, the display portion 101a, the display portion 101b, and the display portion 102a perform displaying images and see them. At this time, the display panel 103 can be turned off. The display portion 104b and the display portion 102b can be turned to non-display.

As described above, as long as at least one of the sensing portion 125b and the sensing portion 125c in the electronic device 100B senses approach of one of the display panels, the motor 122 makes the roller 121 rotate continuously; thus, motions of turning over a page in order and in reverse can be performed any number of times.

At least part of this embodiment can be implemented in combination with another embodiment described in this specification as appropriate.

Embodiment 2

In this embodiment, an electronic device 150 having a structure partly different from that of the electronic device 100 in Embodiment 1 will be described with reference to FIGS. 5A and 5B and FIGS. 6A and 6B. Note that the description in Embodiment 1 can be referred to for components of the electronic device 150 that are also included in the electronic device 100.

<Structure of Electronic Device>

Figure 5A:
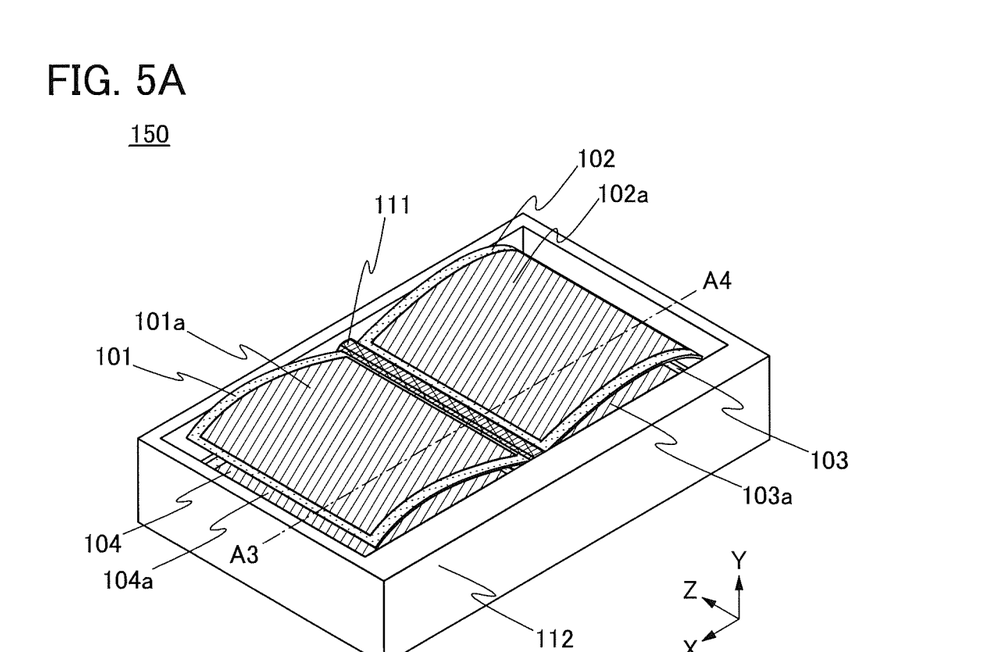
FIGS. 5A and 5B illustrate a structure of an electronic device of an embodiment.
Figure 5B:
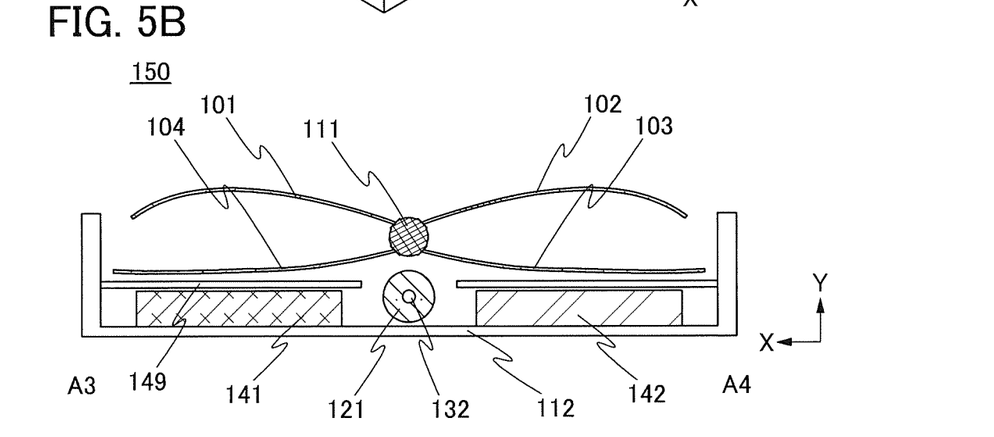
Figure 6A:
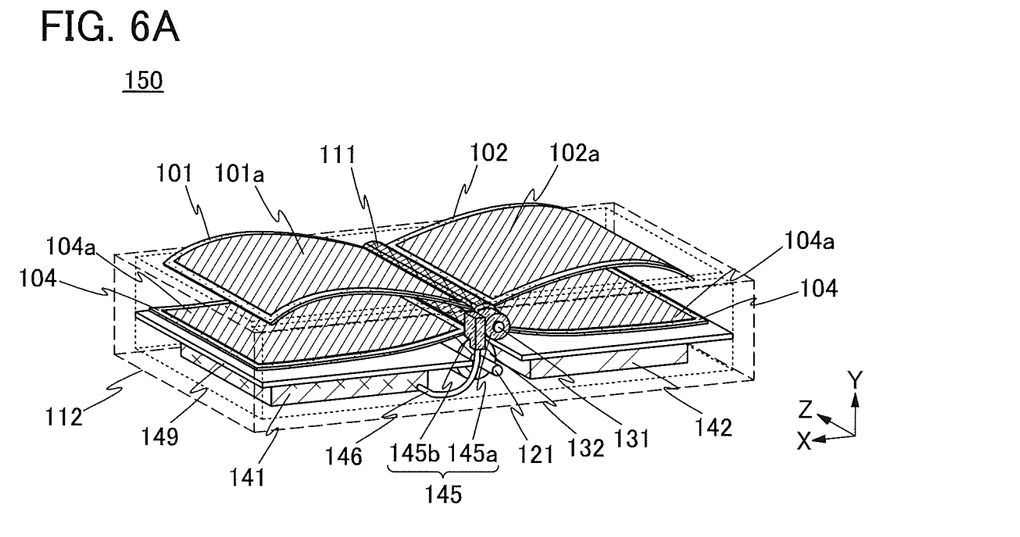
FIGS. 6A and 6B illustrate a structure of an electronic device of an embodiment.

FIG. 5A is a perspective view of the electronic device 150 of one embodiment of the present invention. FIG. 5B is a cross-sectional view along dashed-dotted line A3-A4 in FIG. 5A. FIG. 6A is a perspective view of the electronic device 150 which is seen from a different angle from that in FIG. 5A. In FIG. 6A, the housing 112 is illustrated such that its outlines are drawn with dashed lines and dotted lines. The dashed lines outline the external surfaces of the housing 112, and the dotted lines outline the inner surfaces of the housing 112.

The electronic device 150 includes the four display panels (the display panel 101, the display panel 102, the display panel 103, and the display panel 104), the shaft 111, the housing 112, the roller 121, and the motor 122 (not illustrated) (see FIGS. 5A and 5B). The description in Embodiment 1 can be referred to for the four display panels, the shaft 111, the housing 112, the roller 121, and the motor 122.

The electronic device 150 also includes a battery 141, a control circuit 142, a slip ring 145, and plates 149 (see FIG. 5B and FIG. 6A).

The battery 141 is provided inside the housing 112, for example on a bottom surface of the housing 112, and has a function of supplying power to the shaft 111. The battery 141 is electrically connected to the shaft 111 via a cable 146 and the slip ring 145. Note that a structure in which the battery 141 can be picked out from the bottom of the housing 112 makes it possible to exchange the batteries 141 depending on the usage time of the electronic device 150. The battery 141 may be electrically connected to the control circuit 142.

The control circuit 142 is provided inside the housing 112, for example on a bottom surface of the housing 112, and has a function of supporting operation of the operating circuit (not illustrated) included in the shaft 111. For example, the control circuit 142 has a function of controlling display of the four display panels. The control circuit 142 includes a memory device for storing electric data (e.g., a solid state drive (SSD), a hard disc drive (HDD), and a flash memory). In addition, the control circuit 142 includes a transmitter or/and a receiver for wireless communication with the shaft 111. The shaft 111 includes a receiver or/and a transmitter for wireless communication with the control circuit 142. Note that the control circuit 142 may be provided with a battery. In addition, the control circuit 142 may be electrically connected to the shaft 111 via the cable 146 and the slip ring 145.

Figure 6B:
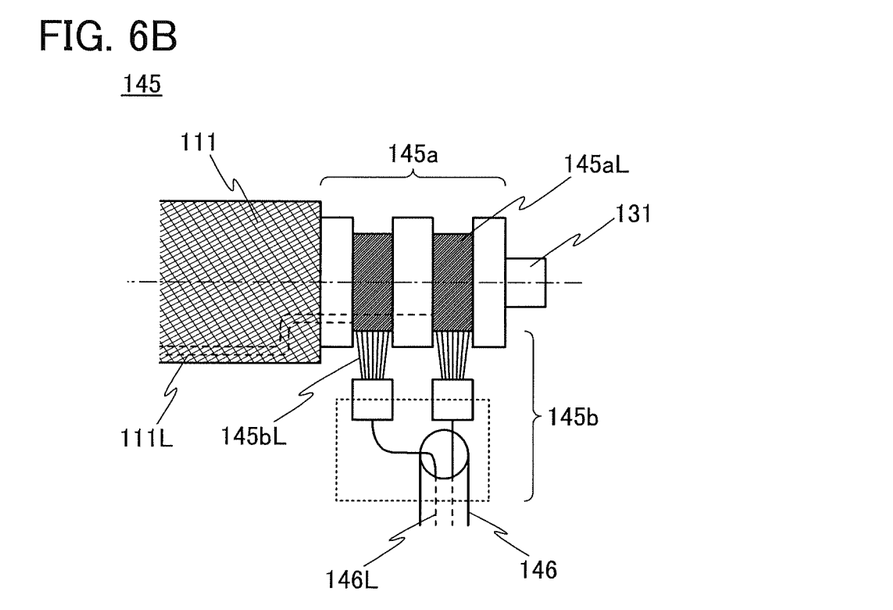

The slip ring 145 includes a ring unit 145a and a brush unit 145b. FIG. 6B is an example of a schematic top view for explaining connection of wirings and the like in the slip ring 145. FIG. 6B partly illustrates the shaft 111, the rotating shaft 131, and the cable 146 in addition to the slip ring 145.

In the ring unit 145a, an outer peripheral surface of a ring-shaped wiring 145aL which is electrically connected to a wiring 111L included in the shaft 111 is not covered. The ring unit 145a is fixed to the shaft 111. When the shaft 111 is rotated, the ring unit 145a is also rotated. In the brush unit 145b, a wiring 146L passing through the cable 146 is electrically connected to a brush-like conductor 145bL. The conductor 145bL is in contact with but not fixed to the wiring 145aL; thus, electrical connection can be maintained even when the ring unit 145a is rotated by the use of the electronic device 150. In FIG. 6B, a central shaft (a center of the rotating shaft 131) along which the shaft 111 and the ring unit 145a are rotated is drawn as a dashed-dotted line, and a case covering part of the brush unit 145b is drawn as a dotted line.

Note that although the electronic device 150 in FIG. 6B includes two wirings 111L, two wirings 145aL, two conductors 145bL, and two wirings 146L as an example, the number of them may each be three or more.

The plates 149 are provided between the battery 141 and the four display panels, and between the control circuit 142 and the four display panels (see FIG. 6A). The plates 149 included in the electronic device 150 can prevent the four display panels from touching the battery 141 and the control circuit 142.

At least part of this embodiment can be implemented in combination with another embodiment described in this specification as appropriate.

This application is based on Japanese Patent Application Serial No. 2016-114581 filed with Japan Patent Office on Jun. 8, 2016, the entire contents of which are hereby incorporated by reference.

What is claimed is:

1. An electronic device comprising:
   first to n-th display panels; and
   a shaft,
   wherein n is a natural number of 4 or more,
   wherein the first to n-th display panels are flexible,
   wherein each of the first to n-th display panels comprises a first surface and a second surface opposite to the first surface,
   wherein the first surface is provided with a first display portion,
   wherein the second surface is provided with a second display portion,
   wherein the shaft comprises an operating circuit,
   wherein the first to n-th display panels are electrically connected to the operating circuit, and
   wherein each of the first to n-th display panels are projected from the shaft.

2. The electronic device according to claim 1, comprising a battery,
   wherein the battery is provided inside the shaft.

3. The electronic device according to claim 1,
   wherein the second display panel is nearest to the first display panel, and
   wherein an angle formed by a straight line connecting a center of the shaft and a project portion of the first display panel and a straight line connecting the center of the shaft and a project portion of the second display panel is more than or equal to $((360/n)-5°)$ and less than or equal to $((360/n)+5°)$ in a cross-sectional view along a plane orthogonal to an extending direction of the shaft.

4. An electronic device comprising:
   first to n-th display panels;
   a shaft;
   a housing;
   a roller; and
   a motor,
   herein n is a natural number of 4 or more,
   wherein the first to n-th display panels are flexible,
   wherein each of the first to n-th display panels comprises a first surface and a second surface opposite to the first surface,
   wherein the first surface is provided with a first display portion,
   wherein the second surface is provided with a second display portion, wherein the shaft comprises an operating circuit,
wherein the first to n-th display panels are electrically connected to the operating circuit,
wherein each of the first to n-th display panels are projected from the shaft,
wherein the shaft is fixed to the housing so as to be rotatable,
wherein the roller is provided inside the housing and below the first to n-th display panels,
wherein the roller is configured to turn over the first display panel to an opposite side beyond the shaft, and
wherein the motor is connected to a rotating shaft of the roller.

5. The electronic device according to claim 4, wherein the roller is positioned so as to overlap with the shaft.

6. The electronic device according to claim 4, comprising a battery,
wherein the battery is provided on a bottom surface of the housing.

7. A method for driving the electronic device according to claim 6, comprising the step of keeping the motor rotating the roller as long as a first sensing portion senses approach of the first display panel.

8. The electronic device according to claim 4, comprising a proximity sensor,
wherein the proximity sensor is electrically connected to the motor,
wherein the proximity sensor is configured to sense approach of an object, and
wherein a sensing medium of the proximity sensor is a DC magnetic field, an AC magnetic field, an electric field, an electromagnetic wave, light, and ultrasonic.

9. The electronic device according to claim 8,
wherein the proximity sensor comprises a first sensing portion, and
wherein the first sensing portion is provided on a straight line together with a center of the shaft and a top of the roller in a cross-sectional view along a plane orthogonal to an extending direction of the shaft.

10. The electronic device according to claim 8,
wherein the proximity sensor comprises a first sensing portion and a second sensing portion, and
wherein the first sensing portion and the second sensing portion are arranged in a direction parallel to a direction in which the first display panel is turned over by the roller.

11. A method for driving the electronic device according to claim 10, comprising the step of keeping the motor rotating the roller as long as at least one of the first sensing portion and the second sensing portion senses approach of the first display panel.

12. The electronic device according to claim 4,
wherein the second display panel is nearest to the first display panel, and
wherein an angle formed by a straight line connecting a center of the shaft and a project portion of the first display panel and a straight line connecting the center of the shaft and a project portion of the second display panel is more than or equal to $((360/n)-5°)$ and less than or equal to $((360/n)+5°)$ in a cross-sectional view along a plane orthogonal to an extending direction of the shaft.

* * * * *